United States Patent
Ye et al.

(10) Patent No.: US 10,367,451 B2
(45) Date of Patent: Jul. 30, 2019

(54) TEMPERATURE-COMPENSATED CRYSTAL OSCILLATOR BASED ON DIGITAL CIRCUIT

(71) Applicant: UNIVERSITY OF ELECTRONIC SCIENCE AND TECHNOLOGY OF CHINA, Chengdu, Sichuan (CN)

(72) Inventors: Peng Ye, Chengdu (CN); Feng Tan, Chengdu (CN); Xingqi Liu, Chengdu (CN); Duyu Qiu, Chengdu (CN); Lianping Guo, Chengdu (CN); Kuojun Yang, Chengdu (CN); Qinchuan Zhang, Chengdu (CN); Huiqing Pan, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 146 days.

(21) Appl. No.: 15/696,533

(22) Filed: Sep. 6, 2017

(65) Prior Publication Data
US 2017/0373638 A1 Dec. 28, 2017

(30) Foreign Application Priority Data
May 17, 2017 (CN) .......................... 2017 1 0348895

(51) Int. Cl.
H03B 5/04 (2006.01)
H03B 5/32 (2006.01)
H03L 1/02 (2006.01)

(52) U.S. Cl.
CPC ............... *H03B 5/04* (2013.01); *H03B 5/32* (2013.01); *H03L 1/02* (2013.01)

(58) Field of Classification Search
CPC ....................................................... H03B 5/04
(Continued)

(56) References Cited

U.S. PATENT DOCUMENTS

| 6,710,663 B1* | 3/2004 | Berquist | ................ | H03L 1/026 |
| | | | | 331/3 |
| 2005/0151592 A1* | 7/2005 | Partridge | ................ | H03B 5/04 |
| | | | | 331/16 |

(Continued)

OTHER PUBLICATIONS

Huang, Xianhe et al., "100-MHz Low-Phase-Noise Microprocessor Temperature-Compensated Crystal Oscillator," IEEE Transactions on Circuits and Systems—II: Express Briefs, vol. 62, No. 7 (2015), pp. 636-640.

*Primary Examiner* — Joseph Chang
(74) *Attorney, Agent, or Firm* — Oliff PLC

(57) ABSTRACT

The present invention provides a temperature-compensated crystal oscillator based on digital circuit, a closed-loop compensation architecture is employed to realize the high precision compensation of the crystal oscillator. The output frequency f(T) of the TCXO to be compensated is directly connected with the compensation voltage Vc(T) in real time, and the compensation voltage is fed back to the voltage control terminal of the VCXO to be compensated to compensate, so that the output frequency after compensation is equal to the target frequency signal, thus avoiding the frequency shift of output signal caused by temperature hysteresis, i.e. the discrepancy between the temperature acquired by a temperature sensor and the real temperature of the resonant wafer in the prior art.

1 Claim, 2 Drawing Sheets

(58) Field of Classification Search
USPC .......................................................... 331/70
See application file for complete search history.

(56) References Cited

U.S. PATENT DOCUMENTS

| | | | |
|---|---|---|---|
| 2009/0146746 A1* | 6/2009 | Unkrich | H03L 1/022 |
| | | | 331/70 |
| 2011/0032049 A1* | 2/2011 | Tahara | H01P 5/16 |
| | | | 333/128 |
| 2013/0313332 A1* | 11/2013 | Isohata | H03L 1/02 |
| | | | 236/1 F |
| 2016/0211853 A1* | 7/2016 | Fukuzawa | H03L 1/00 |
| 2016/0365865 A1 | 12/2016 | Nicholls et al. | |
| 2017/0085271 A1 | 3/2017 | Hammes et al. | |

* cited by examiner

TEMPERATURE-COMPENSATED CRYSTAL OSCILLATOR BASED ON DIGITAL CIRCUIT

FIELD OF THE INVENTION

This application claims priority under the Paris Convention to Chinese Patent Application No. 2017103448895.1, Filed May 17, 2017, the entirety of which is hereby incorporated by reference for all purposes as if fully set forth herein.

The present invention relates to the field of crystal oscillator, more particularly to a temperature-compensated crystal oscillator based on digital circuit.

BACKGROUND OF THE INVENTION

Temperature-Compensated Xtal (crystal) Oscillator (hereinafter referred as TCXO) is a kind of crystal oscillator which can work in a wide temperature range and keep the output frequency of the crystal oscillator within a certain accuracy range ($10^6$~$10^{-7}$ orders of magnitude) through a certain compensation. It has a characteristic of low power consumption, working upon power-up, high stability and so on. Therefore it has been widely used in various communications, navigation, radar, satellite positioning system, mobile communication, program-controlled telephone switch and various electronic measuring instruments.

The temperature-compensated crystal oscillator in prior art is essentially a Voltage-Controlled Xtal (crystal) Oscillator (hereinafter referred as VCXO) with a temperature compensated network which produces a temperature-dependent compensation voltage. The key component in the uncompensated voltage-controlled crystal oscillator is a AT-cut quartz crystal, which temperature characteristic curve is approximately a cubic curve, and the cubic curve can be expressed as:

$$f(T)=a_3(T-T_0)^3+a_1(T-T_0)+a_0 \quad (1)$$

Where $a_3$ is the coefficient of cubic term, $a_1$ is the coefficient of linear term, $a_0$ is the oscillating frequency at a reference temperature $T_0$, T is the temperature of the location the AT-cut quartz crystal is at.

The frequency linear gain characteristics of the VCXO in prior art can be approximately expressed as:

$$f(VC)=-G(VC-VC_0)+f_0 \quad (2)$$

where G is the gain of the VCXO, VC is the control voltage of the VCXO, $VC_0$ is the input voltage of the voltage control terminal of the VCXO, $f_0$ is the oscillating frequency when the input voltage is $VC_0$.

Then, the equation of the compensation voltage of the crystal temperature characteristic can be expressed as:

$$VC(T)=A_3(T-T_0)^3+A_1(T-T_0)+A_0 \quad (3)$$

Where $A_3=a_3/G$, $A_1=a_1/G$, $A_0$ is a compensation voltage when the temperature T is $T_0$.

In order to implement equation (3), it is necessary to generate a temperature compensation voltage applied to the VCXO for temperature compensation to counteract the frequency temperature characteristic, thereby obtaining a stable frequency output within a wide temperature range, and realizing the purpose of temperature compensation.

FIG. 1 is a diagram of a TCXO based on digital circuit in prior art. The TCXO uses digital temperature compensation with an open-loop architecture. As shown in FIG. 1, it comprises a temperature sensor and conditioning circuit 101, a microprocessor 102, a compensation network 103, and a VCXO 104. The temperature T is acquired by the temperature sensor and conditioning circuit 101, and then input into the microprocessor 102 to find the compensation voltage value according to the temperature in the temperature-compensated voltmeter. Then the compensation network 103 converts the compensation voltage value into a compensation voltage, and inputs the compensation voltage to the voltage control terminal of VCXO 104 to make it output a signal with stable frequency. It can be seen that the temperature-dependent compensation voltage is directly applied to the voltage control terminal of the VCXO 104 (to be compensated) to realize temperature compensation.

Where the temperature-compensated voltmeter is constructed in advance by collecting the voltage of the VCXO 104 at different temperatures while maintaining the frequency stabilization. A more detailed description of the construction can be found in following references:

1. Huang X, Liu D, Wang Y, et al. 100-MHz Low-Phase-Noise Microprocessor Temperature-Compensated Crystal Oscillator[J]. Circuits & Systems II Express Briefs IEEE Transactions on, 2015, 62(7):636-640;
2. "Temperature compensation for an oscillator crystal", Inventor: Markus Hammes etc, US Patent Publication Number: US 20170085271A1, Date of Publication: Mar. 23, 2017;
3. "Digitally compensated phase locked oscillator", Inventor: Nicholls Charles William tremlett, etc, US Patent Publication Number: US 20160365865A1, Date of publication: Dec. 15, 2016.

In sum, the TCXO in prior art uses an open-loop compensation architecture, a temperature sensor is needed, and the temperature sensor should be as closer as possible to the crystal resonator on a circuit. However, the resonant wafer of the crystal oscillator is individually enclosed in a confined space, which inevitably produces a temperature hysteresis between the temperature sensor and the resonant wafer, leading that there is no significant breakthrough in the TCXO frequency temperature characteristics. Especially for the crystal oscillator with high frequency output, the temperature hysteresis is more obvious.

SUMMARY OF THE INVENTION

The present invention aims to overcome the deficiencies of the prior art and provides a TCXO based on digital circuit to avoid the frequency shift of output signal caused by temperature hysteresis, i.e. the discrepancy between the temperature acquired by a temperature sensor and the real temperature of the resonant wafer.

To achieve these objectives, in accordance with the present invention, a TCXO based on digital circuit, comprising:
a VCXO for generating a signal with desired frequency;
a compensation network for generating a desired compensation voltage based on a compensation voltage value and sending the desired compensation voltage to the voltage control terminal of the VCXO to make the VCXO generate a stable signal with desired frequency;
wherein further comprising a power divider, an analog-to-digital converter and a microprocessor;
where the power divider divides the signal with desired frequency signal into two signals: one is used as the output of the TCXO and the other is sent to the analog-to-digital converter;
the analog-to-digital converter converts the signal with desired frequency into a corresponding frequency value with binary form, and sends the corresponding frequency value to the microprocessor, a binary coding table, in which a plurality of frequency values and their respective corresponding compensation voltage values are filled is stored in the microprocessor, the microprocessor finds a compensation voltage value in the binary coding table according to the frequency value sent by the analog-to-digital converter, and sends it to the compensation network.

The objectives of the present invention are realized as follows:

In the present invention, i.e. a TCXO based on digital circuit, a closed-loop compensation architecture is employed to realize the high precision compensation of the crystal oscillator. Firstly, the VCXO rates a signal with desired frequency, and a power divider divides the signal with desired frequency into two signals, one is used as the output of the TCXO and the other is sent to the analog-to-digital converter, the analog-to-digital converter converts the signal with desired frequency into a corresponding frequency value with binary form, and sends the frequency value to the microprocessor, through a pro-stored binary coding table, in which a plurality of frequency values and their respective corresponding compensation voltage values are filled, the microprocessor finds a compensation voltage value in the binary coding table according to the frequency value sent by the analog-to-digital converter. Secondly, the compensation network converts the compensation voltage value into the desired compensation voltage, and then sends it back to the voltage control terminal of the VCXO, which make the VCXO generate a stable signal with desired frequency, thus the temperature compensation is realized, and avoid the frequency shift of output signal caused by temperature hysteresis, i.e. the discrepancy between the temperature acquired by a temperature sensor and the real temperature of the resonant wafer in the prior art.

Comparing to the TCXO based on digital circuit in prior art, the present invention has the following advantageous features:

(1) No temperature sensor is needed, and the temperature compensation is realized through a correspondence between the frequency value of a output frequency to be compensated and compensation voltage value in present invention. Moreover, the present invention overcomes the temperature hysteresis problem caused by the discrepancy between the temperature acquired by a temperature sensor and the real temperature of the resonant wafer in the prior art;

(2) a closed-loop feedback compensation architecture is employed in the present invention, thus the real-time high precision compensation is realized more easily.

(3) The compensation process in the present invention is simple, and the compensation voltage can be obtained directly by finding the binary coding table according to the frequency value sent by the analog-to-digital converter. Moreover, the structure of the present invention is also simple, easy to be integrated and mass-produced;

(4) The present invention can be well applied to crystal oscillators of various frequencies, especially, for the crystal oscillator with high frequency output, which has poor compensation effect in prior art, a better compensation effect can be achieved.

BRIEF DESCRIPTION OF THE DRAWING

The above and other objectives, features and advantages of the present invention will be more apparent from the following detailed description taken in conjunction with the accompanying drawings, in which.

DETAILED DESCRIPTION OF THE PREFERRED EMBODIMENT

Figure 1:
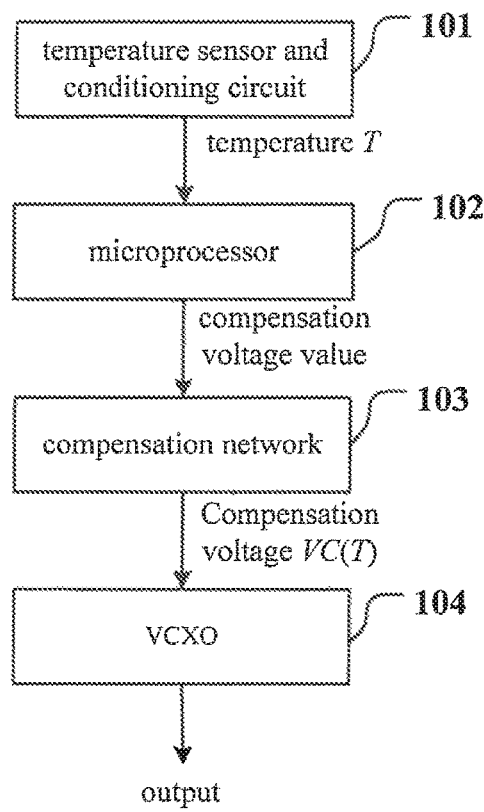
FIG. 1 is a diagram of a TCXO based on digital circuit in prior art.

Hereinafter, preferred embodiments of the present invention will be described with reference to the accompanying drawings. It should be noted that the similar modules are designated by similar reference numerals although they are illustrated in different drawings. Also, in the following description, a detailed description of known functions and configurations incorporated herein will be omitted when it may obscure the subject matter of the present invention.

Figure 2:
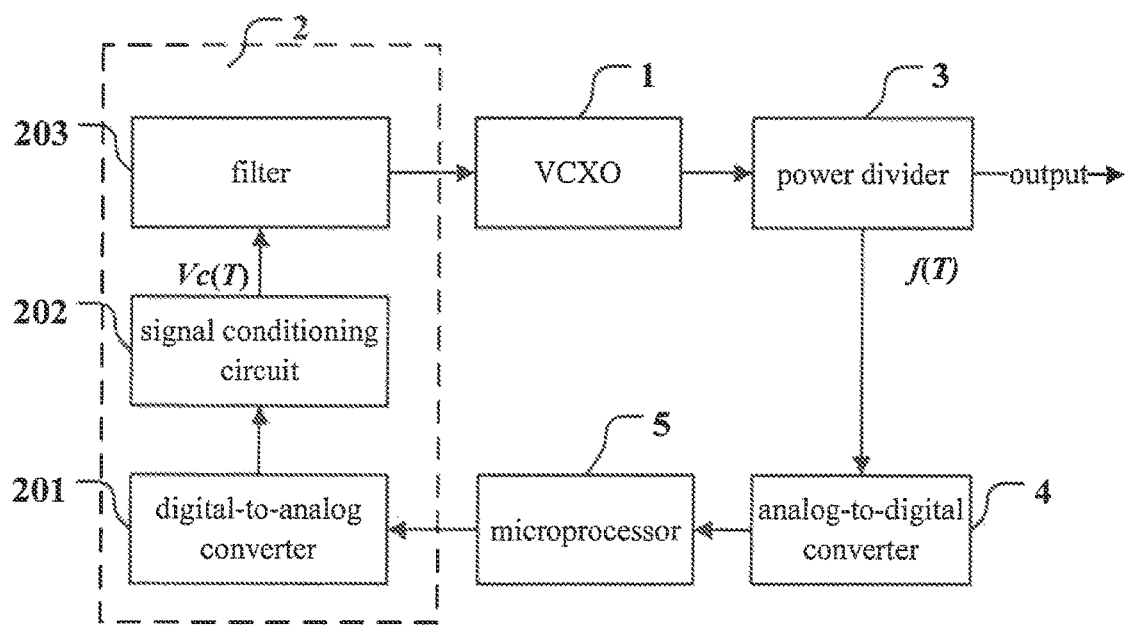
FIG. 2 is a diagram of a TCXO based on digital circuit according to one embodiment of the present invention.

FIG. 2 is a diagram of a TCXO based on digital circuit according to one embodiment of the present invention.

In one embodiment, as shown in FIG. 2, the TCXO based on digital circuit comprises a voltage controlled crystal oscillator, i.e. VCXO 1, a compensation network 2, a power divider 3, an analog-to-digital converter 4 and a microprocessor 5;

The VCXO 1 generates a signal with desired frequency, and the power divider 3 divides the signal with desired frequency into two signals, one is used as the output of the TCXO and the other as input is sent to the analog-to-digital converter 4. the analog-to-digital converter 4 converts the signal with desired frequency into a corresponding frequency value with binary form, and sends the frequency value to the microprocessor 5, the microprocessor 5 has a pre-stored binary coding table, in which a plurality of frequency values and their respective corresponding compensation voltage values are filled, the microprocessor 5 finds a compensation voltage value in the binary coding table according to the frequency value sent by the analog-to-digital converter and sends it to the compensation network 2. The compensation network 2 generates a desired compensation voltage based on a compensation voltage value and sends the desired compensation voltage to the voltage control terminal of the VCXO 1 to make the VCXO 1 generate a stable signal with desired frequency;

In one embodiment, as shown in FIG. 2, the compensation network 2 comprises a digital-to-analog converter 201, a signal conditioning circuit 202 and a filter 203. The digital-to-analog converter 201 converts the compensation voltage value into a corresponding analog voltage signal, and the signal conditioning circuit 202 modulates the analog voltage signal to generate a compensation voltage $V_c(T)$. The filter 203 filters the compensation voltage $V_c(T)$, and sends the compensation voltage $V_c(T)$ to the voltage control terminal of the VCXO 1 to make the VCXO 1 generate a stable signal with desired frequency.

In one embodiment, an implementation process of the present invention is as follows:

Step 1: Collecting a data on the output frequency f(T)—the corresponding compensation voltage $V_c(T)$ At the room temperature, inputting a compensation voltage to the voltage control terminal of the VCXO 1, so that the output frequency of the VCXO 1 is the target frequency $f_0$. On this basis, collecting the output frequency f(T) of the VCXO 1, when the temperature is T, adjusting the compensation voltage $V_c(T)$ to make the output frequency of the VCXO 1 changed to the target frequency $f_0$, recording the value of the compensation voltage $V_c(T)$; changing the ambient temperature T continuously, repeating aforementioned steps to obtain the data on the output frequency $f(T)$—the corresponding compensation voltage $V_c(T)$.

Step 2: Constructing a binary coding table, in which a plurality of frequency values and their respective corresponding compensation voltage values are filled Converting the values of the output frequency $f(T)$ and the corresponding compensation voltage $V_c(T)$ obtained from step 1 into binary codes to construct the binary coding table, in which a plurality of frequency values and their respective corresponding compensation voltage values are filled, and storing the binary coding table into the microprocessor 5.

Step 3: Obtaining the Compensation Voltage Value and Convert it into the Corresponding Analog Voltage Signal Finding a compensation voltage value in the binary coding table according to the frequency value sent by the analog-to-digital converter 4, and sending it to the digital-to-analog converter 201 and converting it into a corresponding analog voltage signal.

Step 4: Modulating and filtering the analog voltage signal converted in step 3 through the signal conditioning circuit 202 and the filter 203 to obtain a compensation voltage $V_c(T)$, and sending the compensation voltage $V_c(T)$ to the voltage control terminal of the VCXO 1 to make the VCXO 1 generate a stable signal with desired frequency $f_0$.

Figure 3:
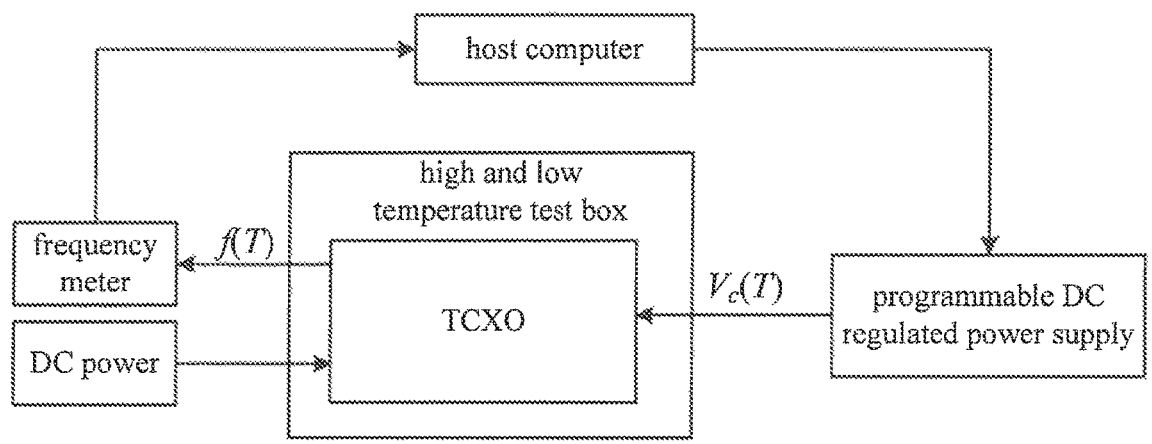
FIG. 3 is a diagram of an acquisition system for obtaining a binary coding table, in which a plurality of frequency values and their respective corresponding compensation voltage values are filled.

FIG. 3 is a diagram of an acquisition system for obtaining a binary coding table, in which the relation of a plurality of frequency values and their respective corresponding compensation voltage values are filled.

In one embodiment, an acquisition system shown in FIG. 3 is employed to obtain a binary coding table, in which a plurality of frequency values and their respective corresponding compensation voltage values are filled.

An implementation process as follows is employed to realize the TCXO based on digital circuit:

Step 1: using an acquisition system shown in FIG. 3 to collect and construct a binary coding table of the TCXO, in which a plurality of frequency values and their respective corresponding compensation voltage values are filled.

Placing a TCXO of the present invention into the high and low temperature test box. When the high and low temperature test box is at a certain temperature T, the output frequency $f(T)$ of the TCXO is converted into a binary code by a frequency meter and sent to a host computer, the host computer controls a programmable DC regulated power supply to change the voltage of the voltage control terminal of the VCXO 1, so that the output frequency of the VCXO 1 is the target frequency $f_0$, then recording the value of the compensation voltage $V_c(T)$, and converting it into a binary code; Changing the ambient temperature T continuously, repeating aforementioned steps to obtain a binary coding table, in which a plurality of frequency values and their respective corresponding compensation voltage values are filled, and storing the binary coding table into the microprocessor 5.

Step 2: disconnecting the acquisition system used in step 1, i.e. just placing the TCXO of the present invention into the high and low temperature test box, where the power divider divides the signal with desired frequency into two signals, one is used as the output of the TCXO and the other as input is sent to the analog-to-digital converter, the analog-to-digital converter converts the signal with desired frequency into a corresponding frequency value with binary form, and sends the frequency value to the microprocessor, the microprocessor finds a compensation voltage value in the binary coding table which is obtained through step 1, the compensation voltage value is sent to a digital-to-analog converter converting it into a corresponding analog voltage signal; modulating and filtering the analog voltage signal through the signal conditioning circuit and the filter to obtain a compensation voltage $V_c(T)$, and sending the compensation voltage $V_c(T)$ to the voltage control terminal of the VCXO to make the VCXO generate a stable signal with desired frequency $f_0$.

Step 3: changing the temperature of the high and low temperature test box, and repeating step 2, a real-time temperature compensation of the TCXO can be achieved under different temperatures. According to the test, the temperature is well be compensated in present invention.

According to the above description, it is understood that the essence of the present invention is that the output frequency $f(T)$ of the TCXO to be compensated is directly connected with the compensation voltage $Vc(T)$ in real time, and the compensation voltage is fed back to the voltage control terminal of the VCXO to be compensated to compensate, so that the output frequency after compensation is equal to the target frequency signal, thus the purpose of temperature compensation is achieved.

While illustrative embodiments of the invention have been described above, it is, of course, understand that various modifications will be apparent to those of ordinary skill in the art. Such modifications are within the spirit and scope of the invention, which is limited and defined only by the appended claims.

What is claimed is:

1. A temperature-compensated crystal oscillator based on digital circuit, comprising:
   a VCXO for generating a signal with desired frequency;
   a compensation network for generating a desired compensation voltage based on a compensation voltage value and sending the desired compensation voltage to the voltage control terminal of the VCXO to make the VCXO generate a stable signal with desired frequency;
   wherein further comprising a power divider, an analog-to-digital converter and a microprocessor;
   where the power divider divides the signal with desired frequency signal into two signals: one is used as the output of the TCXO and the other is sent to the analog-to-digital converter;
   the analog-to-digital converter converts the signal with desired frequency into a corresponding frequency value with binary form, and sends the corresponding frequency value to the microprocessor;
   a binary coding table, in which a plurality of frequency values and their respective corresponding compensation voltage values are filled is stored in the microprocessor, the microprocessor finds a compensation voltage value in the binary coding table according to the frequency value sent by the analog-to-digital converter, and sends it to the compensation network; and
   wherein the compensation network comprises a digital-to-analog converter, a signal conditioning circuit and a filter, the digital-to-analog converter converts the compensation voltage value into a corresponding analog voltage signal, and the signal conditioning circuit modulates the analog voltage signal to generate a compensation voltage $V_c(T)$, the filter filters the compensation voltage $V_c(T)$, and sends the compensation voltage $V_c(T)$ to the voltage control terminal of the VCXO to make the VCXO generate a stable signal with desired frequency.

* * * * *